US009236420B2

(12) United States Patent
Lee et al.

(10) Patent No.: US 9,236,420 B2
(45) Date of Patent: Jan. 12, 2016

(54) FLEXIBLE ORGANIC LIGHT-EMITTING DISPLAY DEVICE AND METHOD FOR MANUFACTURING THE SAME

(71) Applicant: LG Display Co., Ltd., Seoul (KR)

(72) Inventors: MiJung Lee, Paju-si (KR); JongHyun Park, Seoul (KR); SooYoung Yoon, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 30 days.

(21) Appl. No.: 14/102,134

(22) Filed: Dec. 10, 2013

(65) Prior Publication Data

US 2014/0183478 A1    Jul. 3, 2014

(30) Foreign Application Priority Data

Dec. 27, 2012  (KR) .................. 10-2012-0155596
Nov. 28, 2013  (KR) .................. 10-2013-0146333

(51) Int. Cl.
  *H01L 27/32*   (2006.01)
  *G06F 3/041*   (2006.01)
  *G02F 1/1333*  (2006.01)

(52) U.S. Cl.
  CPC .......... *H01L 27/323* (2013.01); *G02F 1/13338* (2013.01); *G06F 3/0412* (2013.01)

(58) Field of Classification Search
  CPC .. H01L 27/323; G02F 1/13338; G06F 3/0412
  See application file for complete search history.

(56) References Cited

U.S. PATENT DOCUMENTS

| 2006/0013967 | A1 | 1/2006 | Mikoshiba et al. | |
| 2006/0254704 | A1* | 11/2006 | Seo et al. ..................... | 156/249 |
| 2008/0099066 | A1* | 5/2008 | Ito et al. ........................ | 136/261 |
| 2008/0211394 | A1* | 9/2008 | Koshihara et al. ............ | 313/504 |
| 2008/0239198 | A1 | 10/2008 | Kim et al. | |
| 2010/0097296 | A1 | 4/2010 | Wang et al. | |
| 2010/0134426 | A1* | 6/2010 | Lee et al. ...................... | 345/173 |
| 2012/0104938 | A1 | 5/2012 | Chu et al. | |
| 2012/0146922 | A1 | 6/2012 | Kang et al. | |
| 2012/0212465 | A1* | 8/2012 | White et al. .................. | 345/205 |
| 2013/0335376 | A1* | 12/2013 | Lee et al. ..................... | 345/174 |

FOREIGN PATENT DOCUMENTS

KR  10-2008-0089743 A   10/2008
KR         101165456   *  7/2012

OTHER PUBLICATIONS

PCT International Search Report for PCT/KR2013/012100, Apr. 29, 2014, 3 Pages.

* cited by examiner

*Primary Examiner* — Allen Parker
(74) *Attorney, Agent, or Firm* — Fenwick & West LLP

(57) ABSTRACT

A flexible organic light-emitting display device and a method of manufacturing the flexible organic light-emitting display device are provided. The flexible organic light-emitting display device comprises a lower flexible substrate assembly and an upper flexible substrate assembly that are bonded by a bonding layer. The lower flexible substrate assembly includes a first flexible substrate, a thin film transistor formed on the first flexible substrate, a white organic light-emitting element formed on the thin film transistor, and an encapsulation layer formed on the white organic light-emitting element. The upper flexible substrate assembly comprises a second flexible substrate, an interlayer and a touch sensing unit formed on the interlayer layer. The interlayer may be at least one of a color filter layer, a transparent resin layer, an insulating film layer and a second flexible substrate.

9 Claims, 10 Drawing Sheets

FLEXIBLE ORGANIC LIGHT-EMITTING DISPLAY DEVICE AND METHOD FOR MANUFACTURING THE SAME

CROSS-REFERENCE TO RELATED APPLICATION

This application claims priority to and the benefit of Korean Patent Application No. 10-2012-0155596, filed on Dec. 27, 2012, the disclosure of which is incorporated herein by reference in its entirety. This application also claims priority to and the benefit of Korean Patent Application No. 10-2013-0146333, filed on Nov. 28, 2013, the disclosure of which is incorporated herein by reference in its entirety.

BACKGROUND

1. Field of Technology

The embodiments herein relate to a flexible organic light-emitting display device using an on-cell touch screen panel, and a method of manufacturing the same.

2. Discussion of Related Art

Examples of display devices used in monitors of computers, TVs, cell phones, etc. include an organic light-emitting display (OLED) and a plasma display panel (PDP) which emit light themselves, and a liquid crystal display (LCD) requiring a separate light source, etc.

In addition, much attention has been focused recently on a flexible display device as a next generation display device, which is manufactured using a flexible material, such as plastic, to allow images to be displayed even when the display device is bent like paper.

The application range of the flexible display device is diverse, ranging from computer monitors and TVs to personal portable equipment. Research has been performed on the flexible display device having a large display area and reduced volume and weight. In addition, research has been performed on the flexible display device to which a touch screen panel allowing a user to input a touch to a display screen using his/her hand or a pen is applied.

SUMMARY

When the touch screen panel is applied to the flexible organic light-emitting display device, an add-on type touch screen panel in which the touch screen panel having an electrode pattern for sensing the touch formed on a base material such as glass is attached to the organic light-emitting display device is applied. However, when the add-on type touch screen panel is used, a thickness of the organic light-emitting display device increases due to the base material, a manufacturing unit cost increases, there are difficulties in the manufacturing process, and in particular, when the add-on type touch screen panel is applied to the flexible organic light-emitting device, the flexibility of the flexible organic light-emitting device is deteriorated and the flexible organic light-emitting device becomes hard and not flexible.

In one embodiment, there is provided a method of manufacturing a flexible organic light-emitting display device, the method comprising: forming a lower flexible substrate assembly including a first flexible substrate, a thin film transistor and an organic light emitting element disposed over a first flexible substrate, the organic light emitting element configured to emit white light and is electrically connected to the thin film transistor; forming a upper flexible substrate assembly including a touch sensing unit having at least one electrode pattern on an interlayer; and bonding together the lower flexible substrate assembly and the upper flexible substrate assembly. Accordingly, the touch sensing unit is formed on one of the interlayer of the upper flexible substrate assembly. The interlayer can be any one of a second flexible substrate, a color filter layer configured to filter the white light, and a transparent resin layer.

In another embodiment, there is provided a flexible organic light-emitting display device. The flexible organic light-emitting display device includes a lower flexible substrate assembly and an upper flexible substrate assembly that are attached to each other. The lower flexible substrate assembly includes a thin film transistor and an organic light-emitting element disposed over a first flexible substrate. The organic light-emitting element is configured to emit white light and electrically connected to the thin film transistor. The upper flexible substrate assembly includes a touch sensing unit, which is disposed on an interlayer in the upper flexible substrate assembly. The interlayer can be any one of a color filter layer, a transparent resin layer, a second flexible substrate and an insulating film layer. A bonding layer is interposed between the lower flexible substrate assembly and the upper flexible substrate assembly to attach the lower flexible substrate assembly and the upper flexible substrate assembly together.

In another embodiment, there is provided a flexible organic light-emitting display device. The flexible organic light-emitting display device includes a first flexible substrate, a thin film transistor, an organic light-emitting element, a flexible encapsulation unit, a color filter layer, a bonding layer and a touch sensing unit. The thin film transistor is disposed on the first flexible substrate. The organic light-emitting element, which is configured to emit white light, is disposed on the thin film transistor. The flexible encapsulation unit is formed on the organic light-emitting element to protect the organic light-emitting element from external environments. Over the flexible encapsulation unit, the color filter layer is disposed. The color filter layer includes a plurality of color filter layer elements, and each of the plurality of color filter layer elements is configured to filter the white light to generate a colored light corresponding to the sub pixel region. The bonding layer is interposed between the flexible encapsulation unit and the color filter layer. The touch sensing unit is disposed on upper, lower or both the upper and lower surfaces of the color filter layer.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings.

DETAILED DESCRIPTION

Figure 1:
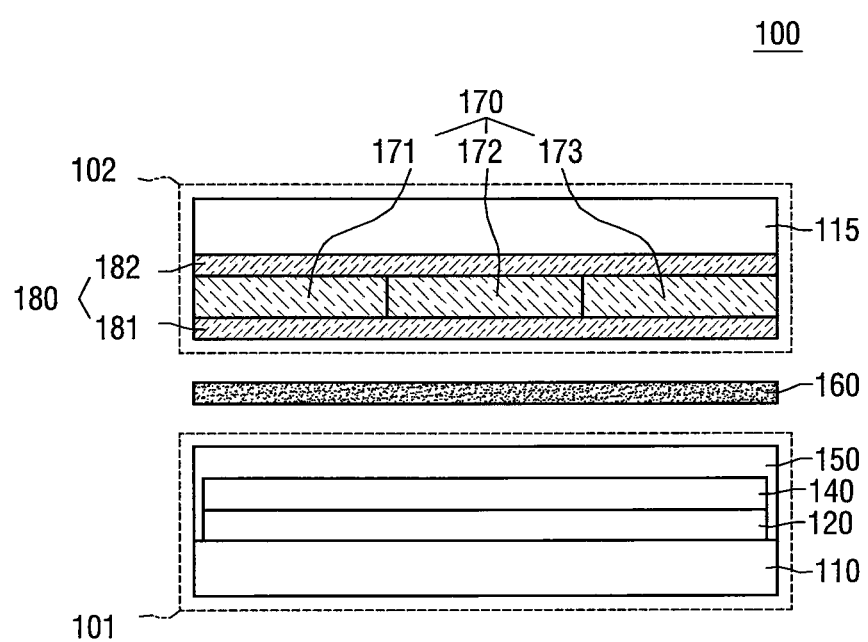
FIG. 1 is a cross-sectional view of a flexible organic light-emitting display device in accordance with one embodiment.

Exemplary embodiments of the present invention will be described in detail below with reference to the accompanying drawings. While the present invention is shown and described in connection with exemplary embodiments thereof, it will be apparent to those skilled in the art that various modifications can be made without departing from the scope of the invention.

An element or layer formed "on" another element or layer includes a case in which an element is directly formed on another element, and a case in which an element is formed on another element with an additional element or layer formed therebetween.

Although the terms first, second, etc. may be used to describe various elements, it should be understood that these elements are not limited by these terms. These terms are only used to distinguish one element from another. For example, a first element could be termed a second element, and, similarly, a second element could be termed a first element, without departing from the scope of exemplary embodiments.

In this specification, a flexible display device refers to a display device endowed with flexibility, and may be used to have the same meaning as a bendable display device, a rollable display device, an unbreakable display device, or a foldable display device. In the description herein, a flexible organic light emitting display device is one example of various flexible display devices.

In this specification, like numbers refer to like elements throughout the description of the drawings. Sizes and thicknesses of respective elements shown in the drawings are shown for the sake of convenience of description only and are not intended to limit the scope of the embodiments disclosed herein.

The features of various exemplary embodiments described herein may be partially or entirely bound or combined with each other, and be technically engaged and driven using various methods as apparent to those skilled in the art, and the exemplary embodiments may be independently practiced alone or in combination.

Hereinafter, various exemplary embodiments will be described in further detail with reference to the accompanying drawings.

FIG. 1 illustrates a flexible organic light-emitting display device 100 including a lower flexible substrate assembly 101 and an upper flexible substrate assembly 102 attached to the lower flexible substrate assembly 101 by a bonding layer 160. The lower flexible substrate assembly 101 refers to the part of the organic light emitting display device 100 including a first flexible substrate 110, a thin film transistor 120, an organic light-emitting element 140 and an encapsulation unit 150. The upper flexible substrate assembly 102 refers to the part of the organic light emitting display device 100 including a color filter layer 170, a touch sensing unit 180 and a second flexible substrate 115.

The lower flexible substrate assembly 101 and the upper flexible substrate assembly 102 are separately manufactured. For example, in the first stage, the thin film transistor 120, the organic light-emitting element 140, the encapsulation unit 150 and one or more insulation layers (e.g., a passivation layer, an interlayer insulation layer, an overcoating layer, etc.), may be formed on the first flexible substrate 110 to manufacture the lower flexible substrate assembly 101. In the second stage, the color filter layer 170 and the touch sensing unit 180 may be formed on the second flexible substrate 115 to manufacture the upper flexible substrate assembly 102. The fabrication process for forming the color filter layer elements 171, 172, and 173 generates heat, which may be intolerable to the organic light emitting element 140. Patterning process for forming the touch sensing unit 180 may also damage the organic light emitting element 140. For this reason, the lower flexible substrate assembly 101 and the upper flexible substrate assembly 102 are manufactured separately from one another, and are subsequently attached together by the bonding layer 160. In the present disclosure, the terms "the first stage" and "the second stage" are used only to distinguish each of the stages for manufacturing the upper flexible substrate assembly 102 and lower flexible substrate assembly 101. It should be understood that the upper flexible substrate assembly 102 and lower flexible substrate assembly 101 can be simultaneously manufactured or in any arbitrary order.

In order to bond the separately manufactured lower flexible substrate assembly 101 and the upper flexible substrate assembly 102, the bonding layer 160 is formed between the lower flexible substrate assembly 101 and the upper flexible substrate assembly 102. More specifically, the bonding layer 160 is formed between the upper most element of the lower flexible substrate assembly 101 and the lower most element of the upper flexible substrate assembly 102. In the embodiment of the flexible organic light emitting display device 100 shown in FIG. 1, the lower most element of the upper flexible substrate assembly 102 is the first electrode pattern 181 of the touch sensing unit 180. As such, the bonding layer 160 is in direct contact with the encapsulation unit 150 of the lower flexible substrate assembly 101 and the touch sensing unit 180 of the upper flexible substrate assembly 102.

In some other embodiments, however, the lower most element of the upper flexible substrate assembly 102 may not be the touch sensing unit 180. Accordingly, the bonding layer 160 may be arranged to be in contact with the color filter layer 170, an insulating film layer, or any other element being the lower most element of the upper flexible substrate assembly 102.

The bonding layer 160 may be an optical clear adhesive (OCA), an optical clear resin (OCR), a super view resin (SVR), an optical elastic resin (OER), a direct bonding resin (DBR), or the like. Ultraviolet (UV) light or heat may be applied to at least one of an OCA, an OCR, an SVR, an OER, a DBR, or the like in a vacuum or atmosphere state, thereby bonding the lower flexible substrate assembly 101 and the upper flexible substrate assembly 102 to each other.

Figure 2A:
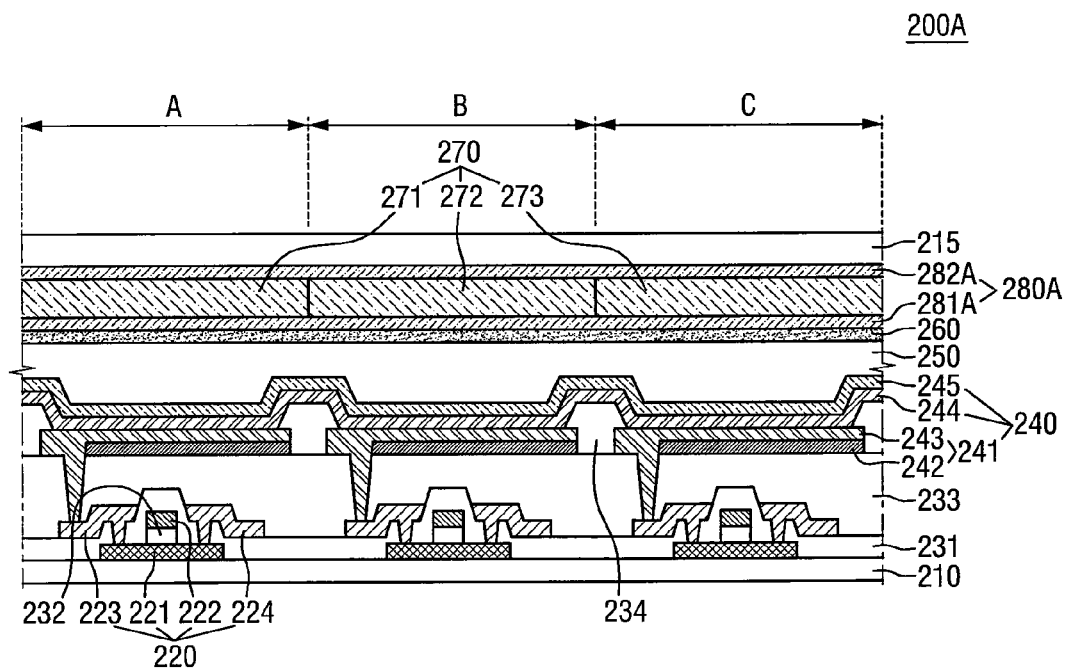
FIGS. 2A to 2D are conceptual diagrams of flexible organic light-emitting display devices in accordance with various embodiments.
Figure 2A:
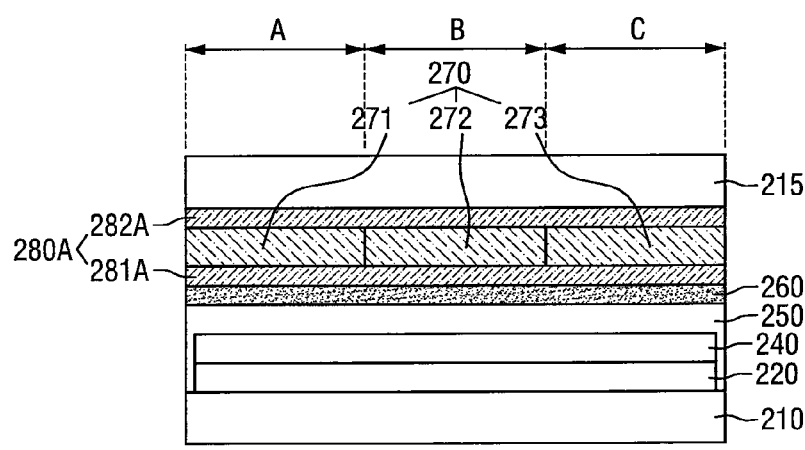

FIG. 2A illustrates one embodiment of a flexible organic light emitting display device 200A that comprises the lower flexible substrate assembly and the upper flexible substrate assembly after being bonded together by a bonding layer 260.

The flexible organic light-emitting display device 200A includes a plurality of pixel regions, in which each of the plurality of pixel regions includes a plurality of sub pixel regions ("A", "B", "C") configured to emit light of a designated color. The pixel region may be referred to as a pixel and the sub pixel region may be referred to a sub pixel herein. In the exemplary embodiment depicted in FIG. 2A, the flexible organic light emitting display device 200A includes a first sub pixel region A (e.g., red sub pixel), a second sub pixel region B (e.g., green sub pixel), and a third sub pixel region C (e.g., blue sub pixel). In some other embodiments, however, each pixel region of the flexible organic light emitting display device 200A may include fewer or additional sub pixel regions. For example, each pixel region of the flexible organic light emitting device 200A may further include a fourth sub pixel region, which may be configured to emit white light. Also, some of the sub pixel regions may be arranged such that they are shared by two or more pixel regions.

The lower flexible substrate assembly includes a first flexible substrate 210, a thin film transistor 220 and an organic light emitting element 240 disposed over the first flexible substrate 210.

The lower flexible substrate assembly includes the first flexible substrate 210. The first flexible substrate 210 is a substrate for supporting and protecting various elements of the flexible organic light-emitting display device 200A. The first flexible substrate 210 is positioned at a lower portion of the flexible organic light-emitting display device 200A. The first flexible substrate 210 may be formed of a flexible insulating material. Examples of the flexible insulating material include polyimide (PI), polyetherimide (PEI), polyethylene terephthalate (PET), polycarbonate (PC), polymethyl methacrylate (PMMA), polystyrene (PS), styrene acrylonitrile copolymer (SAN), silicon-acryl resin, etc. In addition, when the flexible organic light-emitting display device 200A is a transparent organic light-emitting display device, the first flexible substrate 210 may be formed of a transparent flexible insulating material.

The lower flexible substrate assembly may include a buffer layer (not shown), which may be formed on first flexible substrate 210. The buffer layer prevents moisture or impurities from permeating through the first flexible substrate 210, and may planarize the surface of the first flexible substrate 210. However, the buffer layer is an optional element, which may or may not be employed depending on the kind of the first flexible substrate 210 or the type of the thin film transistor 220 used in the flexible organic light-emitting display device 200A. The materials for forming the buffer layer may include, for example, silicon oxide, silicon nitride or a combination thereof.

The thin film transistor 220 includes the active layer 221, the gate electrode 222, the source electrode 223, and the drain electrode 224. The thin film transistor 220 may be formed for each pixel region or each sub pixel region, and may allow each pixel region or each sub pixel region to be individually driven. The thin film transistor 220 may be formed on the first flexible substrate 210 to allow the organic light-emitting layer 244 to emit light. In general, in order to allow the organic light-emitting layer 244 to emit light by means of image information of a data signal input in response to a scan signal, a switching thin film transistor and a driving thin film transistor are employed. Further, the flexible organic light-emitting display device 200A may further include a thin film transistor for a compensation circuit designed to maintain or improve the reliability of the flexible organic light-emitting display device 200A. The transistors depicted in the figures of the present disclosure may be any one of the aforementioned transistors.

The thin film transistor may be classified as an inverted-staggered type or a coplanar type depending on positions of elements constituting the thin film transistor. In the present specification, the thin film transistor 220 of the coplanar type is shown for convenience of description. However, the embodiments herein are not limited thereto and may employ the thin film transistor having the inverted-staggered type.

In the case where the coplanar type thin film transistor 220 is used, its active layer 221 is formed on the first flexible substrate 210. The active layer 221 can be formed on the buffer layer if the buffer layer is employed in the organic light emitting display device 200A. The active layer 221 includes a channel region where the channel is formed when the bias current is applied. The active layer 221 further includes a source region and a drain region that are in contact with a source electrode 223 and a drain electrode 224, respectively. The active layer 221 may be formed of amorphous silicon, polycrystalline silicon, or an oxide semiconductor. As a constituent material of the oxide semiconductor included in the active layer 221, a four-component metal oxide such as an InSnGaZnO-based material; a three-component metal oxide such as an InGaZnO-based material, an InSnZnO-based material, an InAlZnO-based material, a SnGaZnO-based material, an AlGaZnO-based material, or a SnAlZnO-based material; a two-component metal oxide such as an InZnO-based material, a SnZnO-based material, an AlZnO-based material, a ZnMgO-based material, a SnMgO-based material, an InMgO-based material, or an InGaO-based material; an InO-based material; a SnO-based material; a ZnO-based material; or the like may be used. A composition ratio of each element included in each of the listed oxide semiconductor materials is not particularly limited and may be variously adjusted.

A gate insulating film 232 is formed on the active layer 221. The gate insulating film 232 insulates the active layer 221 and the gate electrode 222 from each other. The gate insulating film 232 may be formed of silicon oxide, silicon nitride, or a stack of layers formed of such materials. However, the gate insulating film 232 is not limited thereto and may be formed of various other materials. Because the gate insulating film 232 need only insulate the active layer 221 and the gate electrode 222 from each other, the gate insulating film 232 is formed only on the active layer 221 as shown in FIG. 2A. The gate insulating film 232, however, can be formed over an entire surface of the first flexible substrate 210. When the gate insulating film 232 is formed over the entire surface of the first flexible substrate 210, the gate insulating film 232 may be formed to have one or more contact holes that open some regions of source and drain regions of the active layer 221.

The gate electrode 222 is formed on the gate insulating film 232. The gate electrode 222 at least partially overlaps the active layer 221, and in particular, overlaps a channel region of the active layer 221. The gate electrode 222 may be formed of, but is not limited to, any one of molybdenum (Mo), aluminum (Al), chromium (Cr), gold (Au), titanium (Ti), nickel (Ni), neodymium (Nd), copper (Cu), or an alloy thereof, and may be formed of various materials. In addition, the gate electrode 222 may be formed as a stack of layers formed of such materials.

An interlayer insulating film 231 is formed on the gate electrode 222. The interlayer insulating film 231 may be formed of the same material as the gate insulating film 232, and may be formed of silicon oxide, silicon nitride, or a stacked layer thereof. However, the interlayer insulating film 231 is not limited thereto and may be formed of various materials. The interlayer insulating film 231 may be formed over an entire surface of the first flexible substrate 210 and may be formed to have a contact hole opening a portion of the active layer 221, and the contact hole may open some regions of source and drain regions of the active layer 221.

The source electrode 223 and the drain electrode 224 are formed on the interlayer insulating film 231. The source electrode 223 and the drain electrode 224 are electrically connected to a source region and a drain region of the active layer 221 through the contact holes formed in the interlayer insulating film 231 and/or the gate insulating film 232, respectively. The source electrode 223 and the drain electrode 224 may be formed of any one of molybdenum Mo, aluminum Al, chromium Cr, gold Au, titanium Ti, nickel Ni, neodymium Nd, copper Cu, and aluminum oxide $Al_2O_3$, or an alloy thereof. However, the source electrode 223 and the drain electrode 224 are not limited thereto and may be formed of various materials. In addition, the gate electrode 222 may be formed as a stack of layers formed of such materials.

A passivation film (not shown) may be formed on the source electrode 223 and the drain electrode 224. The passivation film protects the thin film transistor 220, and may be formed of the same material as the interlayer insulating film 231 and/or the gate insulating film 232. The passivation film may be formed as a single layer formed of any one of materials such as a silicon oxide, a silicon nitride, and $Al_2O_3$, or as a multi-layer thereof. However, the passivation film is not limited thereto and may be formed of various materials.

An overcoating layer 233 is formed on the source electrode 223 and the drain electrode 224. The overcoating layer 233 may be referred to as a planarizing film. When the passivation film is formed, the overcoating layer 233 may be formed on the passivation film. The overcoating layer 233 planarizes the top of the first flexible substrate 210. In addition, the overcoating layer 233 may be formed to have a contact hole exposing the source electrode 223 or the drain electrode 224. The overcoating layer 233 may be formed of at least one material of a polyacrylate resin, an epoxy resin, a phenolic resin, a polyamide resin, a polyimide rein, an unsaturated polyester resin, a poly-phenylenether resin, a poly-phenylenesulfide resin, and benzocyclobutene. However, the overcoating layer is not limited thereto and may be formed of various materials.

An organic light-emitting element 240 including an anode 241, an organic light-emitting layer 244, and a cathode 245, is formed on the first flexible substrate 210. The organic light-emitting element 240 is driven by a principle in which holes supplied from the anode 241 and electrons supplied from the cathode 245 are combined in the organic light-emitting layer 244, thereby forming an image.

The thin film transistor 220 and the organic light-emitting element 240 described above may be disposed in each of the sub pixel regions, and the thin film transistor 220 disposed in each sub pixel region may be configured to individually drive the corresponding organic light-emitting element 240 in the sub pixel region. In other words, each of the sub pixel regions may be driven independently from the other sub pixel regions.

A bank layer 234 is formed on the overcoating layer 233. The bank layer 234 acts to differentiate between adjacent sub pixel regions, and may be disposed between adjacent sub pixel regions. In addition, the bank layer 234 may be formed to expose a portion of the anode 241. The bank layer 234 may be formed of an organic insulating material, for example, any one of a polyimide, photo acryl, and benzocyclobutene (BCB). The bank layer 234 may be tapered. When the bank layer 234 is tapered, the bank layer 234 may be formed using a positive type photoresist. The bank layer 234 may be formed to have a thickness for dividing adjacent sub pixel regions.

The anode 241 is formed on the overcoating layer 233. The anode 241 may be connected to the source electrode 223 or drain electrode 224 of the thin film transistor 220 via the contact hole formed in the overcoating layer 233, depending on the type of the thin film transistor 220.

The anode 241 should supply holes, and is thus formed of a conductive material having a high work function. The anode 241 may include a transparent conductive layer 243 having a high work function, and the transparent conductive layer 243 may be formed of a transparent conductive oxide (TCO) such as Indium Tin Oxide (ITO), Indium Zinc Oxide (IZO), Indium Tin Zinc Oxide (ITZO), a zinc oxide, or a tin oxide.

As shown in FIG. 2A, when the flexible organic light-emitting display device 200A is a top-emission type organic light-emitting display device, the anode 241 includes a reflective layer 242 formed below the transparent conductive layer 243. The anode 241 may further include a separate low-resistance reflective layer 242 for reflecting the light toward the top of the flexible organic light-emitting display device 200A. The reflective layer 242 is formed of a conductive layer having a high reflectivity such as silver (Ag), nickel (Ni), gold (Au), platinum (Pt), aluminum (Al), copper (Cu), or Mo/AlNd. In the present specification, the anode 241 is shown as including the transparent conductive layer 243 and the reflective layer 242. However, the anode 241 may be formed of the transparent conductive layer 243 alone, and the reflective layer 242 may be defined to be a separate element. In addition, the anode 241 is formed of the transparent conductive material having a high work function and the reflective metal layer in the present specification. However, the anode 241 itself may have a high work function and may be formed of a conductive material having high reflectivity.

Any one of the transparent conductive layer 243 and/or the reflective layer 242 of the anode 241 may be electrically connected to the source electrode 223. Referring to FIG. 2A, the reflective layer 242 is formed on the overcoating layer 233, a contact hole is formed in the overcoating layer 233, and the transparent conductive layer 243 may thus be electrically connected to the source electrode 223. It is shown that the transparent conductive layer 243 is electrically connected to the source electrode 223 in FIG. 2A for convenience of description. However, the reflective layer 242 may be electrically connected to the source electrode 223 via the contact hole formed in the overcoating layer 233, and the transparent conductive layer 243 may be formed on the reflective layer 242 to be electrically connected to the source electrode 223 via the reflective layer 242.

The anode 241 is separately formed for each sub pixel region. That is, the anode 241 formed in the first sub pixel region A, the anode 241 formed in the second sub pixel region B, and the anode 241 formed in the third sub pixel region C may be electrically connected to respective thin film transistors to individually drive the respective sub pixel regions.

The flexible organic light-emitting display device 200A uses the organic light-emitting layer 244 configured to emit white light and the color filter layer 270 including a plurality of color filter layer elements 271, 272, and 273 for filtering the white light to generate a desired color of light. In FIG. 2A, it is shown that the organic light-emitting layer 244 configured to emit white light is formed continuously over the first sub pixel region A, the second sub pixel region B, and the third sub pixel region C. However, the embodiments herein are not limited thereto, and the white organic light-emitting layer 244 may be formed separately on the respective first sub pixel region A, second sub pixel region B, and third sub pixel region C.

The cathode 245 is formed on the organic light-emitting layer 244. The cathode 245 may be connected to a separate voltage interconnection to apply the same voltage to all sub pixel regions.

The cathode 245 should supply electrons and is thus formed of a material having a high electrical conductivity and a low work function. A specific material for forming the cathode 245 may differ depending on the emission type of the flexible organic light-emitting display device 200A. As shown in FIG. 2A, when the flexible organic light-emitting display device 200A is the top emission type organic light-emitting display device, the cathode 245 may be formed of a very thin metallic material having a low work function. For example, the cathode 245 can be formed of the metallic material having a low work function, such as Ag, Ti, Al, Mo, or an alloy of silver (Ag) and magnesium (Mg), may be used. Also, the cathode 245 can be formed to have a thickness of hundreds of Å or less, for example, 200 Å or less. Even when the material for forming the cathode 245 is an opaque metal having high reflectivity, if it is formed as sufficiently thin layer (e.g., equal to or less than 200 Å), the cathode 245 can be formed as a substantially transparent electrode. In addition, carbon nanotube (CNT) and/or graphene based materials, which have sufficient electrical conductivity and optical transparency, may also be used to form the cathode 245.

The encapsulation unit 250 serving as a sealing member covering the organic light-emitting element 240 is formed on the organic light-emitting element 240 including the cathode 245. The encapsulation unit 250 may protect elements within the flexible organic light-emitting display device 200A such as the thin film transistor 220 and the organic light-emitting element 240 from external moisture, air, impact, or the like.

The encapsulation unit 250 may be configured in various ways depending on the arrangement of the elements within the flexible organic light-emitting display device 200A (e.g., thin film transistor 220, the organic light-emitting element 240). For example, the encapsulation unit 250 can seal the organic light emitting element 240 by using thin film encapsulation (TFE), face seal, and the like.

As described herein, among the various encapsulation manners, flexible thin film encapsulation (TFE) is described as being employed for the encapsulation unit 250. A TFE may be an organic TFE, an inorganic TFE, or an organic-inorganic composite TFE. Among these various types of TFE, the inorganic TFE is advantageous in terms of encapsulating property. However, the inorganic TFE is prone to cracks caused by impurities during the formation of the film, making it difficult to secure the flexibility and increasing the fabrication time. On the other hand, the organic TFE is advantageous in securing the flexibility, but generally has a poor encapsulating property. Accordingly, it is preferred that the organic-inorganic composite TFE, which is advantageous in both the encapsulation property and the flexibility, is to be employed as the encapsulation unit 250.

The upper flexible substrate assembly includes a second flexible substrate 215, a color filter layer 270 and touch sensing unit 280A, and is attached to the lower flexible substrate assembly by the bonding layer 260 interposed therebetween.

The second flexible substrate 215 is a substrate for supporting and protecting several elements of the flexible organic light-emitting display device 200A, and is disposed to face the first flexible substrate 210. The second flexible substrate 215 may be formed of a flexible insulating material, and may be formed of substantially the same material as the first flexible substrate 210. As shown in FIG. 2A, when the flexible organic light-emitting display device 200A is the top emission type organic light-emitting display device, the second flexible substrate 215 may be formed of the transparent flexible insulating material.

As shown in FIG. 2A, the color filter layer 270 is included in the upper flexible substrate assembly. Since the color filter layer 270 is included within the upper flexible substrate assembly, the color filter layer 270 may be also referred herein as an interlayer. The color filter layer 270 includes a plurality of color filter layer elements 271, 272, and 273 that are each formed in a corresponding sub pixel region. For instance, the color filter layer 270 includes a first color filter layer element 271 formed in the first sub pixel region A, a second color filter layer element 272 formed in the second sub pixel region B, and a third color filter layer element 273 formed in the third sub pixel region C. As described above, when the first sub pixel region A is a red sub pixel region, the second sub pixel region B is a green sub pixel region, and the third sub pixel region C is a blue sub pixel region, the first color filter layer element 271 may be a red color filter layer element, the second color filter layer element 272 may be a green color filter layer element, and the third color filter layer element 273 may be a blue color filter layer element.

The white light emitted by the organic light-emitting layer 244 passes through the first color filter layer element 271 formed in the first sub pixel region A to be red light, passes through the second color filter layer element 272 formed in the second sub pixel region B to be green light, and passes through the third color filter layer element 273 formed in the third sub pixel region C to be blue light. As shown in FIG. 2A, when the flexible organic light-emitting display device 200A is a top emission type organic light-emitting display device, the color filter layer 270 is disposed above the organic light-emitting layer 244, and formed in the upper flexible substrate assembly.

The touch sensing unit 280A is included in the upper flexible substrate assembly. The touch sensing unit 280A is an input sensing unit for sensing a touch, and includes the first electrode pattern 281A and the second electrode pattern 282A. The first electrode pattern 281A and the second electrode pattern 282A are formed on lower and upper surfaces of the color filter layer 270, respectively. The first electrode pattern 281A and the second electrode pattern 282A are insulated from each other by the color filter layer 270 disposed between the first electrode pattern 281A and the second electrode pattern 282A.

The first electrode pattern 281A and the second electrode pattern 282A of the touch sensing unit 280A are formed on the lower and upper surfaces of color filter layer 270, respectively. The first and second electrode patterns (281A, 282A) are formed of a transparent conductive material. The materials for forming the first electrode pattern 281A and the second electrode pattern 282A may include, but are not limited to, a CNT and/or graphene based material, metal nanowires, a conductive polymer, and an oxide such as ITO, IZO and zinc oxide, and the likes. These electrode patterns (281A, 282A) can be formed, for example, using general sputtering process without any modification, and thus manufacturing of the touch sensing unit 280A within the flexible organic light emitting display device 200A can be realized without excessive cost.

The first electrode pattern 281A and the second electrode pattern 282A for sensing touch collectively form the touch sensing unit 280A, and each one of the electrode patterns may be either a sensing electrode pattern or a driving electrode pattern. For example, when the first electrode pattern 281A is the driving electrode pattern, the second electrode pattern 282A is the sensing electrode pattern. In this setting, when a driving signal is applied to the first electrode pattern 281A near the position at which the touch actually occurred, the amount of change in the sensing signal occurring on the second electrode pattern 282A near the position at which the touch actually occurred will be the greatest. Accordingly, the touch position can be sensed based on the driving signal applied to the first electrode pattern 281A and the sensing signal sensed in the second electrode pattern 282A.

The electrode pattern of the touch sensing unit 280A may include a first direction sensing electrode pattern (e.g., first or second electrode pattern 281A, 282A) and a second direction sensing electrode pattern (e.g., first or second electrode pattern 281A, 282A). The first and second direction sensing electrode patterns may be insulated from each other by a separate insulating material. The first direction sensing electrode pattern may be a sensing electrode pattern for sensing a first direction (e.g., X or Y axis) coordinate, and the second direction sensing electrode pattern may be a sensing electrode pattern for sensing a second direction (e.g., X or Y axis) coordinate. Accordingly, when the touch input is applied to a predetermined position of the upper flexible substrate assembly, the first direction coordinate sensed in the first direction sensing electrode pattern and the second direction coordinate sensed in the second direction sensing electrode pattern may be combined to sense the touch position.

A black matrix (not shown) may be formed on the second electrode pattern 282A. The black matrix is formed at each of boundaries between sub pixel regions. The black matrix may be formed of chromium Cr or another opaque metallic film, or may be formed of a resin. The black matrix may distinguish between each sub pixel region and the color filter layer 270 formed in each sub pixel region. In addition, a polarizing film (not shown) may be disposed in the upper flexible substrate assembly 115. When the polarizing film is formed in the upper flexible substrate assembly, the polarizing film may be formed on the upper surface of the second electrode pattern 282A or formed on the upper flexible substrate assembly.

Conventionally, the aforementioned electrodes of the touch sensing unit 280A were formed on a separate touch substrate (e.g., PET film), which is prepared in addition to the lower and the upper flexible substrate assemblies. When a separate touch substrate is used, increase in the thickness of the display device is inevitable. Adding a separate touch substrate on the lower and upper flexible substrate assemblies also degrades the overall flexibility. Moreover, adding the separate touch substrate increases the overall manufacturing cost and complicates the manufacturing process.

According to the flexible organic light-emitting display device 200A of an embodiment, the touch sensing unit 280A is formed without adding a separate touch substrate. In particular, the first electrode pattern 281A is formed on the lower surface (i.e., a first surface) of the color filter layer 270 and the second electrode pattern 282A is formed on the upper surface (i.e., a second surface) of the color filter layer 270. The elimination of the separate touch substrate reduces the thickness of the flexible organic light-emitting display device 200A, simplifies the manufacturing process, decreases the overall manufacturing cost, and improves the flexibility of the flexible organic light-emitting display device 200A. Furthermore, the integrating the touch sensing unit 280A within the upper flexible substrate assembly further reduces permeation of moisture even with the increased flexibility.

Figure 2B:
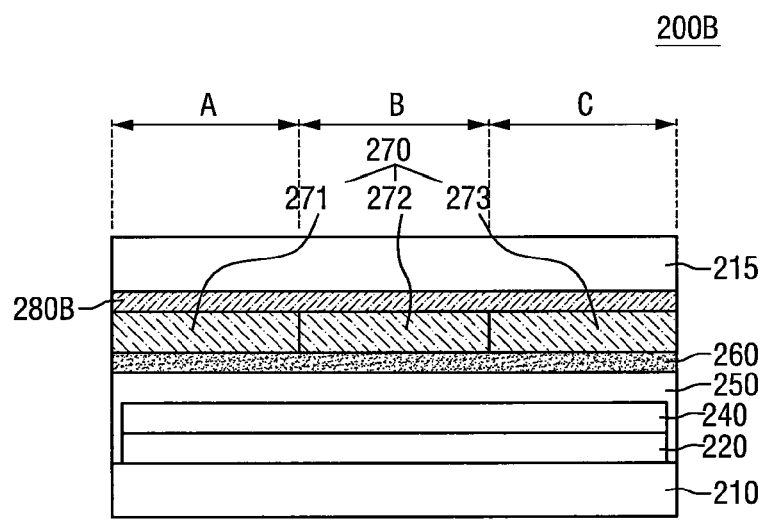
Figure 2C:
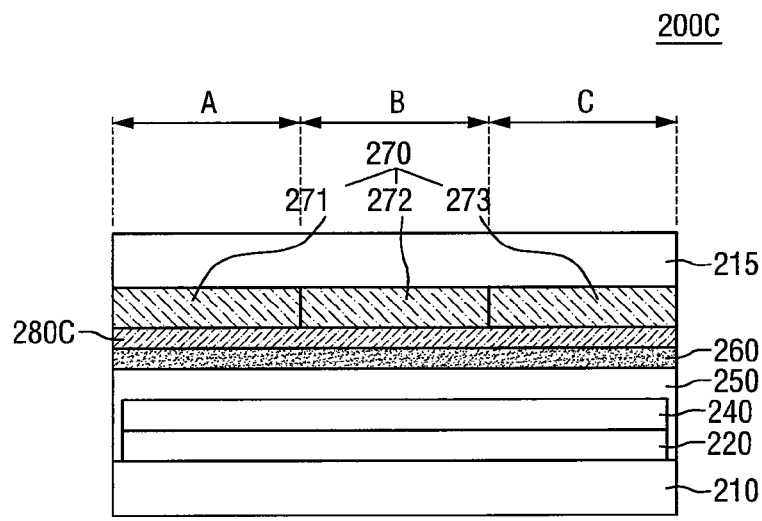

FIGS. 2B and 2C illustrates exemplary embodiments of a touch sensing unit (280B, 280C) having a single layered structure. The single layered structure can be formed as a mutual capacitance touch type or as a self-capacitance touch type. In the mutual capacitance touch type, the first and the second electrode patterns may be formed on the same surface of the color filter layer 270. In other words, both the first and the second electrode patterns are formed on one of the upper and the lower surfaces of the color filter layer 270. As described above, either one of the first electrode pattern and the second electrode pattern is the sensing electrode pattern and the other electrode pattern is the driving electrode pattern. Also, one of the first electrode pattern and the second electrode pattern can be either the first direction sensing electrode pattern or the second direction sensing electrode pattern. The self-capacitance touch type includes a single electrode pattern that carries out the functionalities of both the first and second electrode patterns described above.

Referring to FIG. 2B, the touch sensing unit 280B is illustrated as being formed on the upper surface of the color filter layer 270. Since the color filter layer 270 is the lower most element of the upper flexible substrate assembly, the lower surface of the color filter layer 270 is in contact with the bonding layer 260. Referring to FIG. 2C, the touch sensing unit 280C is illustrated as being formed on the lower surface of the color filter layer 270. Since the touch sensing unit 280C is the lower most element of the upper flexible substrate assembly, the lower surface of the touch sensing unit 280C is in contact with the bonding layer 260.

Figure 2D:
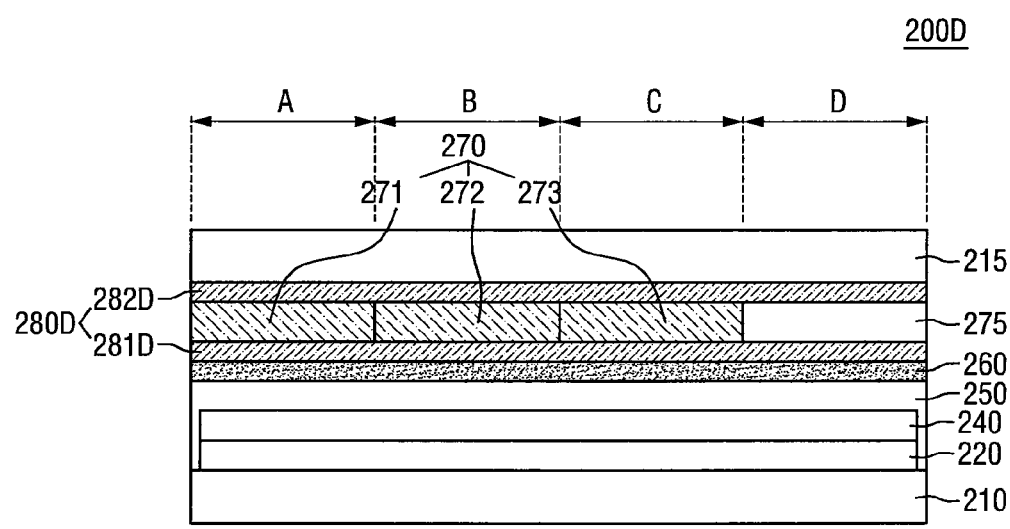

FIG. 2D is a cross-sectional view of a flexible organic light-emitting display device 200D in accordance with another embodiment. In addition to the sub pixel regions described above (i.e., red, green, blue sub pixel regions), the exemplary embodiment shown in FIG. 2D further includes a fourth sub pixel region D (i.e., white sub pixel region) configured to emit white light. By employing this additional white sub pixel region, the overall luminance of the flexible organic light emitting display device 200D can be increased without unnecessary power consumption.

A transparent resin layer 275 is formed in the upper flexible substrate assembly corresponding to the white sub pixel region. In the white sub pixel region, the light from the organic light emitting element needs not be filtered. Therefore, a color filter layer 270 is not formed in the white sub pixel region, but instead, the white light emitted from the organic light emitting element 240 simply passes through the transparent resin layer 275 without being changed into a different color.

Similar to the touch sensing unit 280A described in reference to FIG. 2A, the touch sensing unit 280D may include the first electrode pattern 281D and the second electrode pattern 282D. These first electrode pattern 281D and the second electrode pattern 282D may be formed on the lower and the upper surfaces of the color filter layer 270 and/or the transparent resin layer 275. As previously mentioned, the touch sensing unit 280D can be formed as a single layered touch sensing unit, which can be, either, a mutual capacitance touch type or as a self-capacitance touch type. The touch sensing unit 280D having the single layered structure can be formed on the upper or the lower surfaces of the color filter layer 270 and the transparent resin layer 275.

Figure 3A:
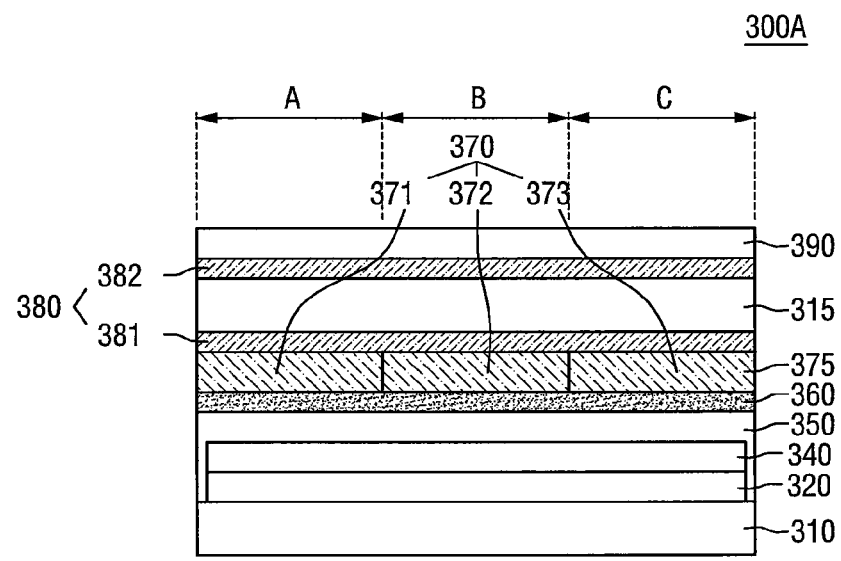
FIGS. 3A and 3B are cross-sectional views of a flexible organic light-emitting display device in accordance with another embodiment.
Figure 3B:
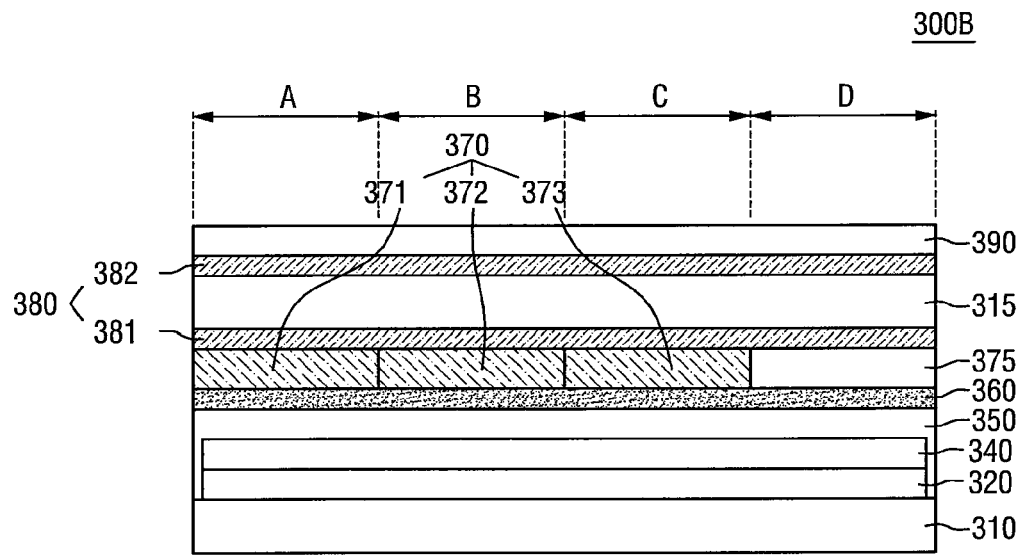

FIG. 3A depicts a flexible organic light emitting display device 300A having three sub pixel regions (e.g., RGB), and FIG. 3B depicts the flexible organic light emitting display device 300B having four sub pixel regions (e.g., RGBW) according to one embodiment. The flexible organic light emitting display device 300A and 300B both include a first flexible substrate 310, a thin film transistor 320, an organic light-emitting element 340 and an encapsulation unit 350. In either case, the touch sensing unit 380 can be formed on at least one of the upper and lower surfaces of the second flexible substrate 315. In the exemplary embodiments shown in FIGS. 3A and 3B, the first electrode pattern 381 and second electrode pattern 382 of the touch sensing unit 380 can be formed on the lower and the upper surfaces of the second flexible substrate 315, respectively. In some other embodiments, however, the touch sensing unit 380 can be formed as a single layered touch sensing unit. In the single layered touch sensing unit, a single electrode pattern, which is configured to carry out the functionalities of both the first and the second electrode patterns, is formed on either the lower or the upper surfaces of the second flexible substrate 315. Since the second flexible substrate 315 is included in the upper flexible substrate assembly, the second flexible substrate 315 may be also referred herein as the interlayer.

A protective film 390 can be further included in the upper flexible substrate assembly to protect elements within the flexible organic light-emitting display device. In the FIGS. 3A and 3B, the protective film 390 is illustrated as being formed on the second electrode pattern 382 using a separate adhesive. The protective film 390 may have a thickness of hundreds of µm or more. The protective film 390 may be formed of a transparent flexible material. For example, the protective film 390 may be formed of any one of a plastic, a metal, a metallic oxide, a ceramic oxide, or a polymer material, or a combination thereof.

Figure 4A:
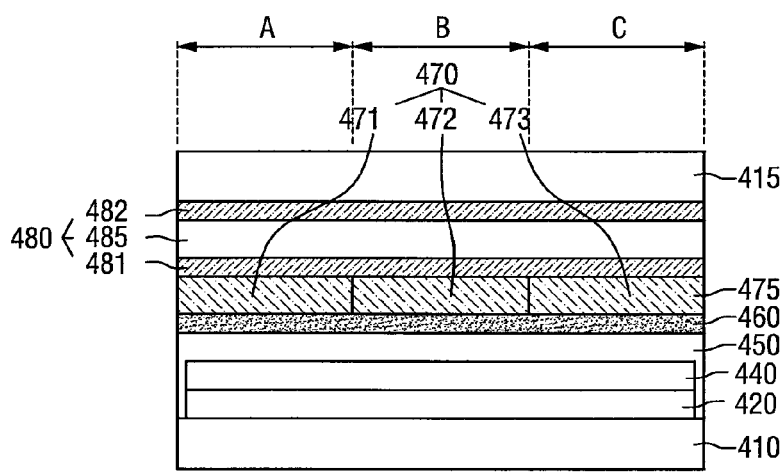
FIGS. 4A to 4C are conceptual diagrams of flexible organic light-emitting display devices in accordance with various embodiments.
Figure 4B:
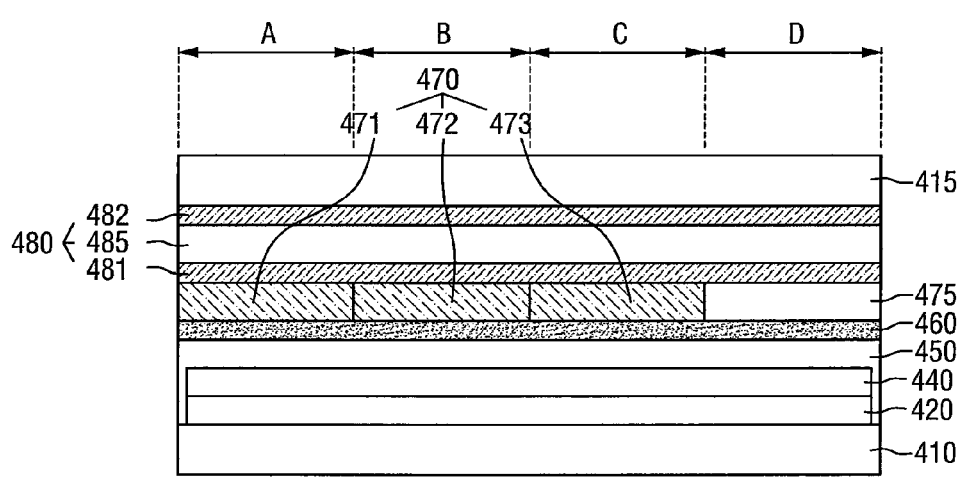

FIG. 4A depicts the flexible organic light emitting display device 400A having three sub pixel regions (e.g., RGB), and FIG. 4B depicts the flexible organic light emitting display device 400B having four sub pixel regions (e.g., RGBW) according to one embodiment. In both cases, the upper flexible substrate assembly may further include an insulating film layer. More specifically, the touch sensing unit within the upper flexible substrate assembly may include an insulating film layer and one or more electrode patterns formed thereon.

In the embodiments shown in the FIGS. 4A and 4B, the flexible organic light emitting display device 400A and 400B both include a first flexible substrate 410, a thin film transistor 420, an organic light-emitting element 440 and an encapsulation unit 450. Furthermore, the touch sensing unit 480 includes a first electrode pattern 481 formed on the lower surface of the insulating film layer 485 and a second electrode pattern 482 formed on the upper surface of the insulating film layer 485. In some other embodiments, however, the touch sensing unit 480 can be formed as a single layered touch sensing unit. In the single layered touch sensing unit, a single electrode pattern, which is configured to carry out the functionalities of both the first and the second electrode patterns (481, 482), is formed on either the lower or the upper surfaces of the insulating film layer 485.

Figure 4C:
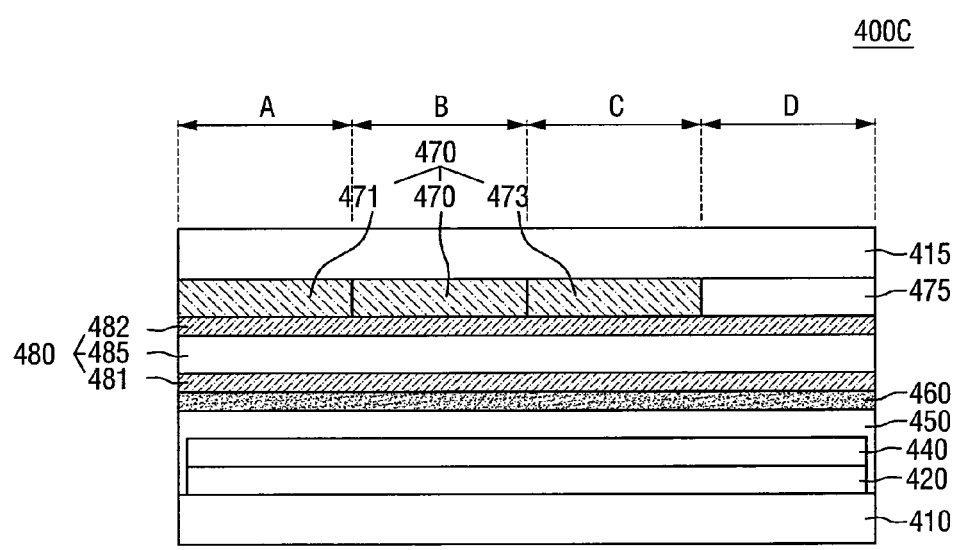

Further, in some other embodiments, the touch sensing unit 480 including the insulating film layer 485 can be formed between the color filter layer 470 (and the transparent resin layer 475 in RGBW configuration of FIG. 4B) and the bonding layer 460 as shown in FIG. 4C. In this setting, the touch sensing unit 480, and more specifically, the lower surface of the insulating film layer 485 or the electrode pattern(s) formed on the lower surface of the insulating film layer 485 is in direct contact with the bonding layer 460.

The insulating film layer 485 may be formed by using a plasma enhanced chemical vapor deposition (PECVD) method for depositing an inorganic film. The PECVD method is a process of lowering the temperature lower than that of general CVD and then depositing a thin film layer, and is a process of injecting a reaction gas between two parallel electrodes. The two parallel electrodes may cause a current to occur on the reaction gas in a plasma state inducing a chemical reaction under the reaction gas, thereby depositing the insulating film layer 485 on the second electrode pattern 482 or the second flexible substrate 415. In addition, the insulating film layer 485 may be formed by a method of depositing $Al_2O_3$ using atomic layer deposition (ALD) equipment. The insulating film layer 485 serves as a spacer maintaining a spaced interval between the second electrode pattern 482 and the first electrode pattern 481. Accordingly, the insulating film layer 485 may be formed of a transparent inorganic film having good heat-resisting, chemical-resisting, electrical insulating, and elastic properties. For example, the insulating film layer 485 may be formed of a silicon oxide layer, a silicon nitride layer, or a stack of the aforementioned layers. Since the insulating film layer 485 is included within the upper flexible substrate assembly, the insulating film layer 485 may be also referred herein as the interlayer.

Figure 5:
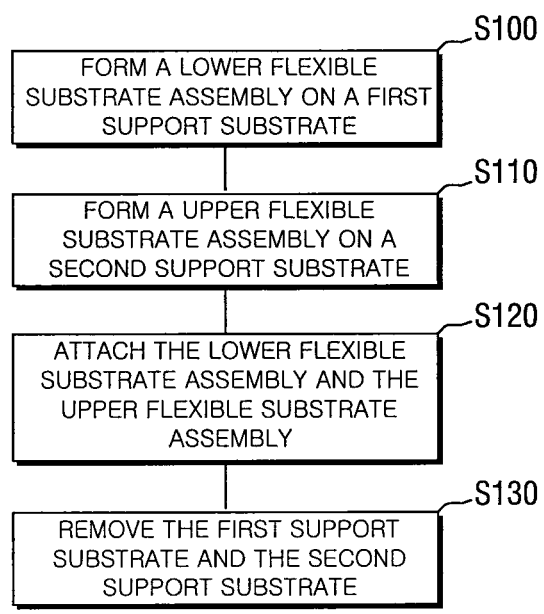
FIG. 5 is a flowchart illustrating a method of manufacturing a flexible organic light-emitting display device in accordance with one embodiment.

FIG. 5 is a flowchart illustrating a method of manufacturing a flexible organic light-emitting display device in accordance with one embodiment. FIGS. 6A to 6D are cross-sectional views of lower and upper flexible substrate assemblies 600A and 600B, respectively, as well as the resulting flexible organic light emitting display device 600D during the manufacturing of a flexible organic light-emitting display device 600D in accordance with an embodiment of the present disclosure.

Figure 6A:
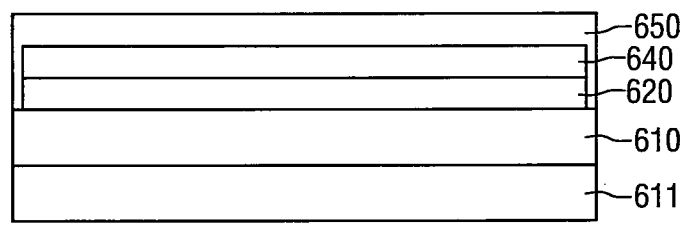
FIGS. 6A to 6D are cross-sectional views of processes illustrating a method of manufacturing a flexible organic light-emitting display device in accordance with one embodiment.
Figure 6B:
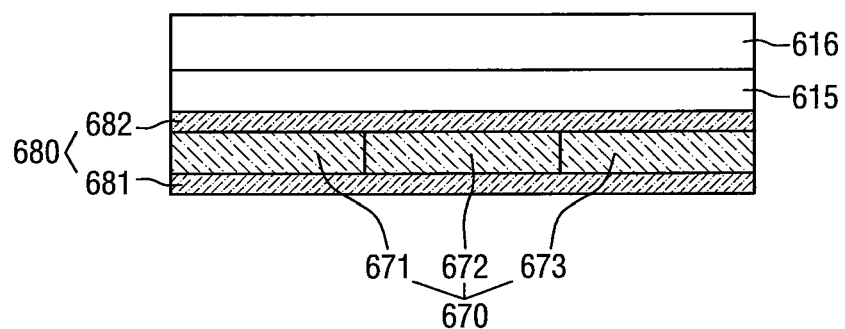

Referring to FIGS. 5, 6A and 6B, in step S100, a lower flexible substrate assembly 600A is formed on a first support substrate 611. In this stage, a thin film transistor 620 and an organic light emitting element 640 are formed on the first flexible substrate 610. This stage also includes a step for forming encapsulating layer 650 for protecting the organic light emitting element 640 from undesired permeation of moisture, gas or other impurities. The lower flexible substrate assembly 600A following the steps described above is depicted in FIG. 6A.

Since plastic materials usually used as materials of the first flexible substrate 610 and the second flexible substrate 615 have lower transition temperatures and significantly lower rigidity than glass, it is difficult to form various elements on the first and second flexible substrates (610, 615) and/or move those substrate. To address this problem, separate support substrates (611, 616) with sufficient rigidity are used to support the elements of the lower and the upper flexible substrate assemblies during the manufacturing process.

Accordingly, referring back to FIG. 5, an upper flexible substrate assembly 600B is formed on a second support substrate 616 in step S110. In this stage, a touch sensing unit 680 and a color filter layer 670 are formed on the second flexible substrate 615. Depending on the type of the organic light emitting element (e.g., RGB or RGBW), a step for forming a transparent resin layer (not shown) may also be included. It should be noted that the order of the step for forming the color filter layer 670 and the step for forming the touch sensing unit 680 may vary depending on the type (e.g., single-layered or multi-layered) and location of the touch sensing unit. For instance, one of the electrode patterns can be formed on the second flexible substrate 615, and the color filter layer 670 can be formed on the electrode pattern formed on the second flexible substrate 615. Following the formation of the color filter layer 670, another electrode pattern can be formed on the color filter layer 670. The upper flexible substrate assembly following the steps of S110 is depicted in FIG. 6B.

When a single-layered touch sensing unit is employed, the color filter layer 670 (and the transparent resin layer) can be formed on the second flexible substrate 615, and then a plurality of electrode patterns are formed on the color filter layer 670 so that it functions as the touch sensing unit. Alternatively, the plurality of electrodes capable of functioning as the touch sensing unit can be formed on the inner surface of the second flexible substrate, and then the color filer layer 680 (and the transparent resin layer in RGBW type) is formed on the plurality of electrode patterns.

Figure 6C:
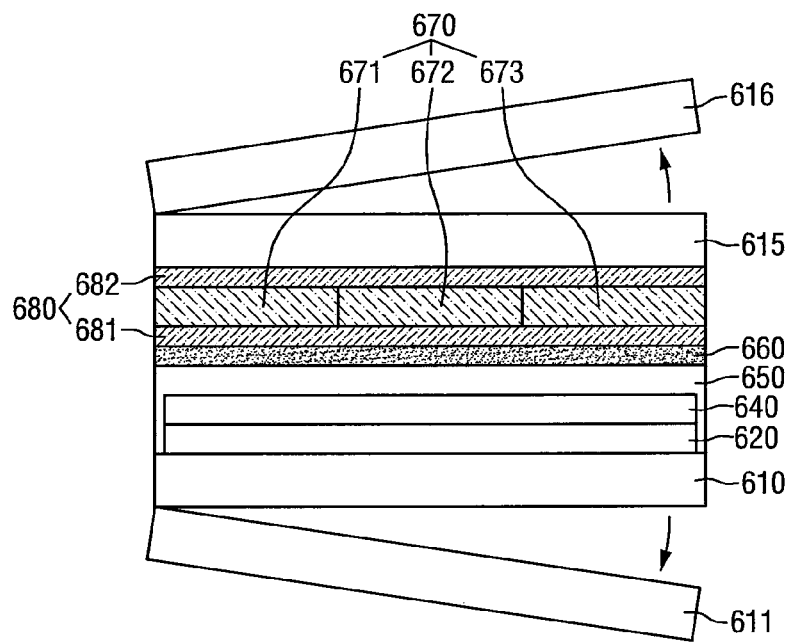
Figure 6D:
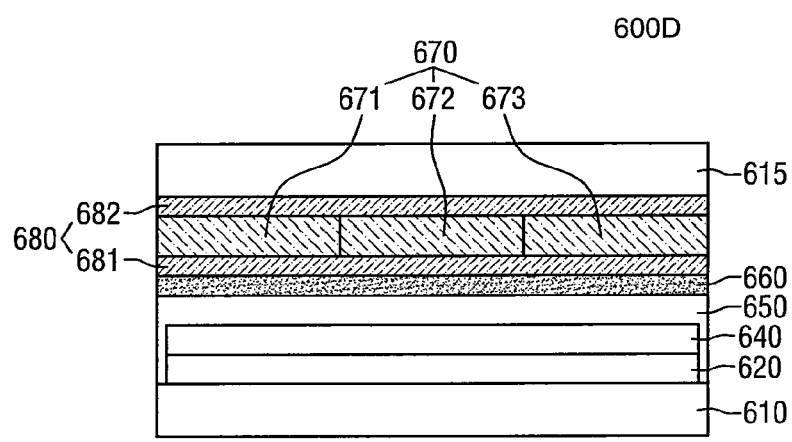

In step S120, the lower flexible substrate assembly 600A and the upper flexible substrate assembly 600B are attached together. In this stage, a bonding layer 660 can be formed on one or both of the lower and the upper flexible substrate assemblies (600A, 600B), and then these substrate assemblies are attached together as illustrated in FIG. 6C.

As described above, the first and the second support substrates (611, 616) are used as temporary substrates for supporting and protecting the lower and the upper flexible substrate assemblies (600A, 600B) during the formation of various other elements therein. Accordingly, in step S130 of FIG. 5, the first support substrate 611 and the second support substrate 616 are removed from the lower flexible substrate assembly 600A and the upper flexible substrate assembly 600B. In order to remove the first and the second support substrates (611,616), a laser may be radiated to the external surfaces of the first and the second support substrates (611, 616).

It should be appreciated that a sacrificing layer (not shown) may be deposited on the first and the second support substrates (611, 616) prior to forming the lower and the upper flexible substrate assemblies (600A 600B). The sacrificing layer formed between the flexible substrate assemblies (600A, 600B) and their corresponding support substrates (611, 616) protect the first and the second flexible substrate (610, 615) of the respective flexible substrate assemblies during the removal of the support substrates (611, 616).

The resulting flexible organic light emitting display device 600D following the steps described above are depicted in FIG. 6D.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different from those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. As such, it should be reminded that any disclaimer made in the instant application should not be read into or against the parent application.

What is claimed is:

1. A method of manufacturing a flexible organic light-emitting display device, the method comprising:
    forming a lower flexible substrate assembly including a first flexible substrate, a thin film transistor and an organic light emitting element disposed over the first flexible substrate, the organic light emitting element configured to emit white light and is electrically connected to the thin film transistor;
    forming a upper flexible substrate assembly including a touch sensing unit having a first electrode pattern and a second electrode pattern on a first surface and a second surface of an interlayer, respectively, the interlayer including a color filter layer configured to filter the white light and a transparent resin layer; and
    bonding together the lower flexible substrate assembly and the upper flexible substrate assembly;
    wherein the first surface and the second surface of the color filter are opposite surfaces of the color filter layer.

2. The method of claim 1, wherein forming the upper flexible substrate assembly comprises:
    forming the first electrode pattern of the touch sensing unit on a second flexible substrate;
    forming the color filter layer and the transparent resin layer on the first electrode pattern; and
    forming the second electrode pattern of the touch sensing unit on the color filter layer and the transparent resin layer, wherein the one of the first electrode pattern and the second electrode pattern is a driving electrode.

3. A flexible organic light-emitting display device comprising:
    a lower flexible substrate assembly including a thin film transistor and a white organic light-emitting element disposed over a first flexible substrate, the white organic light-emitting element configured to emit white light and electrically connected to the thin film transistor;
    an upper flexible substrate assembly having a touch sensing unit disposed on a color filter layer; and
    a bonding layer interposed between the lower flexible substrate assembly and the upper flexible substrate assembly to attach the lower flexible substrate assembly and the upper flexible substrate assembly together,
    wherein the touch sensing unit includes a first electrode pattern and a second electrode pattern, and
    wherein the first electrode pattern is disposed on a first surface of the color filter layer and the second electrode pattern is disposed on a second surface of the color filter layer;
    wherein the first surface and the second surface of the color filter layer are opposite surfaces of the color filter layer.

4. The flexible organic light-emitting display device of claim 3,
    wherein the first electrode pattern is configured as a driving electrode and the second electrode pattern is configured as a sensing electrode.

5. The flexible organic light-emitting display device of claim 3, wherein the first electrode pattern and the second electrode pattern are both configured as a sensing electrode.

6. The flexible organic light-emitting display device of claim 3, wherein the touch sensing unit is a self-capacitance type touch sensing unit having a plurality of electrode patterns disposed on the first surface and the second surface of the color filter layer, and wherein each of the plurality of electrode patterns is arranged to not overlap with another electrode pattern of the plurality of electrode patterns.

7. A flexible organic light-emitting display device comprising:
    a first flexible substrate;
    a thin film transistor disposed on the first flexible substrate;
    an organic light-emitting element disposed on the thin film transistor, the organic light emitting element configured to emit white light;
    a flexible encapsulation unit formed on the organic light-emitting element;
    a color filter layer having a plurality of color filter layer elements, each of the plurality of color filter layer elements configured to filter the white light to generate a colored light corresponding to each of the plurality of color filter layer elements at a sub pixel region associated with each of the plurality of color filter layer elements;

a bonding layer disposed between the flexible encapsulation unit and the color filter layer; and a touch sensing unit including a first electrode pattern disposed on a first surface of the color filter layer and a second electrode pattern disposed on a second surface of the color filter layer;

wherein the first surface and the second surface of the color filter layer are opposite surfaces of the color filter layer.

8. The flexible organic light-emitting display device of claim 7, further comprising:

a transparent resin layer configured to pass through the white light emitted from the organic light emitting element at a white sub pixel region of the flexible organic light-emitting display device.

9. The flexible organic light-emitting display device of claim 8, wherein the first electrode pattern is disposed on a first surface of the transparent resin layer, and the second electrode pattern is disposed a second surface of the transparent resin layer; and wherein the first surface and the second surface of the transparent resin layer are opposite surfaces of the transparent resin layer.

* * * * *